(12) United States Patent
Chen et al.

(10) Patent No.: US 8,520,387 B2
(45) Date of Patent: Aug. 27, 2013

(54) SERVER CABINET

(75) Inventors: Chien-An Chen, Taipei (TW);
Kai-Yang Tung, Taipei (TW);
Ming-Hung Shih, Taipei (TW);
Chun-Ying Yang, Taipei (TW);
Yen-Cheng Lin, Taipei (TW)

(73) Assignee: Inventec Corporation, Taipei (TW)

( * ) Notice: Subject to any disclaimer, the term of this patent is extended or adjusted under 35 U.S.C. 154(b) by 235 days.

(21) Appl. No.: 13/158,598

(22) Filed: Jun. 13, 2011

(65) Prior Publication Data
US 2012/0111534 A1    May 10, 2012

(30) Foreign Application Priority Data
Nov. 5, 2010    (TW) .............................. 99138220 A

(51) Int. Cl.
*H05K 7/20*    (2006.01)
(52) U.S. Cl.
USPC ................. 361/699; 361/679.47; 361/679.48; 361/679.53; 361/689; 165/80.4; 165/80.5; 165/104.33; 165/185; 62/259.2
(58) Field of Classification Search
USPC .................. 361/679.46–679.53, 679.55, 688, 361/689–695, 715–727; 165/80.2–80.5, 165/104.33, 121–126, 185; 175/50, 54, 59, 175/60, 70 R, 71 R, 71 A, 72 R, 168, 173, 175/520; 312/223.2, 223.3, 223.6, 330.1, 312/334.1, 334.5, 334.7, 334.8; 454/184; 62/259.2
See application file for complete search history.

(56) References Cited

U.S. PATENT DOCUMENTS

| | | | | |
|---|---|---|---|---|
| 6,305,180 | B1 * | 10/2001 | Miller et al. | 62/259.2 |
| 6,488,214 | B1 * | 12/2002 | Nicolai et al. | 237/69 |
| 7,051,802 | B2 * | 5/2006 | Baer | 165/299 |
| 7,319,594 | B2 * | 1/2008 | Nicolai et al. | 361/724 |
| 7,511,960 | B2 * | 3/2009 | Hillis et al. | 361/702 |
| 8,004,839 | B2 * | 8/2011 | Sato et al. | 361/696 |
| 8,322,155 | B2 * | 12/2012 | Tutunoglu et al. | 62/208 |
| 2001/0042616 | A1 * | 11/2001 | Baer | 165/299 |
| 2008/0232064 | A1 * | 9/2008 | Sato et al. | 361/687 |
| 2010/0033931 | A1 * | 2/2010 | Miyazawa et al. | 361/696 |

FOREIGN PATENT DOCUMENTS

| | | |
|---|---|---|
| TW | I237174 | 8/2005 |
| TW | M337947 | 8/2008 |

* cited by examiner

*Primary Examiner* — Michail V Datskovskiy
(74) *Attorney, Agent, or Firm* — Morris Manning & Martin LLP; Tim Tingkang Xia, Esq.

(57) ABSTRACT

A server cabinet includes a rack, at least one assembling frame, a radiator and at least one fan. The rack has a first frame and a second frame opposite to each other. The assembling frame and the radiator are mounted on the first frame in sequence. The radiator transfers a coolant to flow inside a plurality of heatsink fins thereof in a circulating manner. The fan is mounted in the assembling frame, and the fan guides an airflow to flow into the first frame from the radiator, and blows the airflow in the rack to the second frame, thus lowering the temperature inside the rack.

10 Claims, 5 Drawing Sheets

SERVER CABINET

CROSS-REFERENCE TO RELATED APPLICATIONS

This non-provisional application claims priority under 35 U.S.C. §119(a) on Patent Application No(s). 099138220 filed in Taiwan, R.O.C. on Nov. 5, 2010, the entire contents of which are hereby incorporated by reference.

BACKGROUND OF THE INVENTION

1. Field of the Invention

The present invention relates to a server cabinet, and more particularly to a server cabinet capable of heat dissipation by blowing air laterally.

2. Related Art

In recent years, Internet has been quickly and vigorously developed, especially for some large enterprises or business places of Internet, due to the requirements of the expansion of services, the quantity of servers becomes larger and larger, which results in more concentrated arrangement and management of the servers to save space. However, the large quantity of servers and other equipment that are arranged intensively produces excess heat inevitably, which further results in unstable operation of the whole server system, and this is always an important issue for a data center.

In order to solve the heat dissipation problem of a large number of the servers placed in a closed room, in a current conventional method, a cooling air-conditioning system is arranged in the room to dissipate heat, or when the number of servers is small, a heat dissipation fan of the server is used for cooling. However, as the number of servers increases, the cabinets are getting more and more crowded, and the cool air blown by the conventional cooling air-conditioning system cannot flow to every corner of the room, and thus the hot air is concentrated in certain areas and the server system becomes unstable.

A fan module inside the conventional server cabinet is installed at the top or on a rear side of the cabinet. When the fan module is installed at the top of the cabinet, a plurality of heat dissipation fans is mounted at the top of the cabinet to draw hot air insider the cabinet to the outside. However, generally, each server cabinet accommodates a plurality of servers, and is of a certain height. Therefore, when the heat dissipation fans draw the hot air, flow paths of the hot air in the server cabinet are often blocked by the plurality of servers, so that the heat dissipation fans can only exhaust the hot air near the top of the server cabinet, but can hardly exhaust the hot air at the bottom of the server cabinet, and the hot air accumulates at the bottom of the server cabinet, thus greatly affecting the operation performance of the servers.

When the fan module is conventionally mounted on the rear side of the server cabinet, the airflow generated by the fan module passes through passages between main boards of the servers respectively, and is then exhausted from a front side of the cabinet. Although the server cabinet with the fan module mounted on the rear side can avoid the accumulation of the hot air at the bottom of the server cabinet, the main boards of the servers are pushed into the cabinet from an opening on the front side of the cabinet, and when the airflow of the fan module is blown from the rear side towards the front side of the cabinet, the airflow is easily blocked by heat dissipation fins on the main board and connectors on the front end of the main board, so that the wind pressure is not high enough to enable the airflow to flow over the main board, the airflow is scattered inside the server cabinet and cannot form a steady flow field inside the server cabinet to effectively flow over electronic components on the main board, and the heat generated by the main board of the server cannot be effectively dissipated, thus eventually resulting in easy accumulation of hot airflows inside the server cabinet.

Furthermore, since the conventional fan module exhausts the hot air inside the server to the outside by guiding airflows or thermal convection, it cannot be ensured that the airflow generated by the fan module can flow to the main board of every server or every heating element on the main board. Therefore, the heat of the servers in the server cabinet is often dissipated unevenly, and a part of the servers are easily damaged due to an excessively high temperature, thus affecting the overall operation performance of the server cabinet.

SUMMARY OF THE INVENTION

In view of the above problems, the present invention is a server cabinet, thereby solving the problems that when a conventional server cabinet uses a fan to dissipate heat by guiding airflows or thermal convention, a smooth and steady airflow field cannot be formed, so that hot air generated by servers easily accumulates in the server cabinet, and that it cannot be ensured that the airflow can flow to every server, so that the heat of the servers is not dissipated evenly, and the overall heat dissipation performance of the server cabinet is seriously affected.

The present invention provides a server cabinet, which comprises a rack, at least one assembling frame, a radiator and at least one fan. The rack has a first frame and a second frame opposite to each other, and an accommodation space is formed inside the rack between the first frame and the second frame. The assembling frame is mounted on the first frame, and the radiator is mounted on the assembling frame. The radiator has a water supply pipeline, a water drain pipeline and a plurality of heatsink fins. The water supply pipeline transfers a coolant to flow into the plurality of heatsink fins. The water drain pipeline drains the coolant from the plurality of heatsink fins. The fan is detachably disposed in the assembling frame, and the fan guides an airflow to flow into the first frame from the radiator, and blows the airflow to the second frame through the accommodation space.

Beneficial effects of the present invention are as follows. The airflow generated by the fan can form a steady flow field in the accommodation space, the airflow in the accommodation space is prevented from flowing back or being blocked by the radiator, and thus the heat dissipation performance is not affected. Meanwhile, the water supply pipeline of the radiator transfers the coolant from the outside into the plurality of heatsink fins, and the coolant is drained to the outside of the rack through the water drain pipeline, so that when a plurality of servers is loaded in the rack, the air flowing between the plurality of heatsink fins can be cooled by the coolant which flows between the outside and the rack in a circulating manner, so as to ensure that the temperature of the air blown into the rack is lower than the temperature of the air retained in the rack, and the heat generated by each of the servers can be removed by heat exchange in the accommodation space, thus greatly improving the overall heat dissipation performance of the server cabinet of the present invention.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
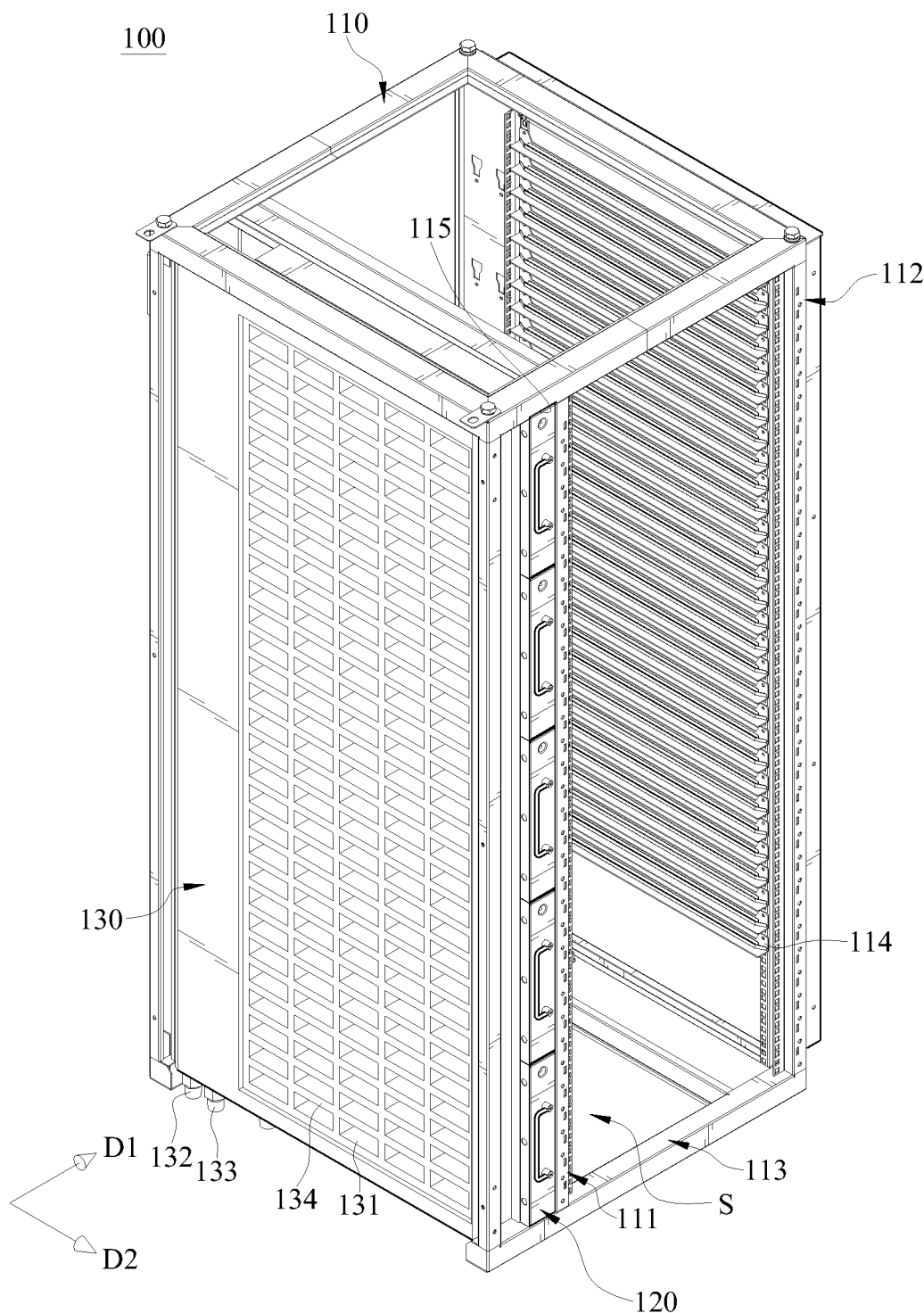
FIG. 1 is schematic assembled view of an embodiment of the present invention.
Figure 2:
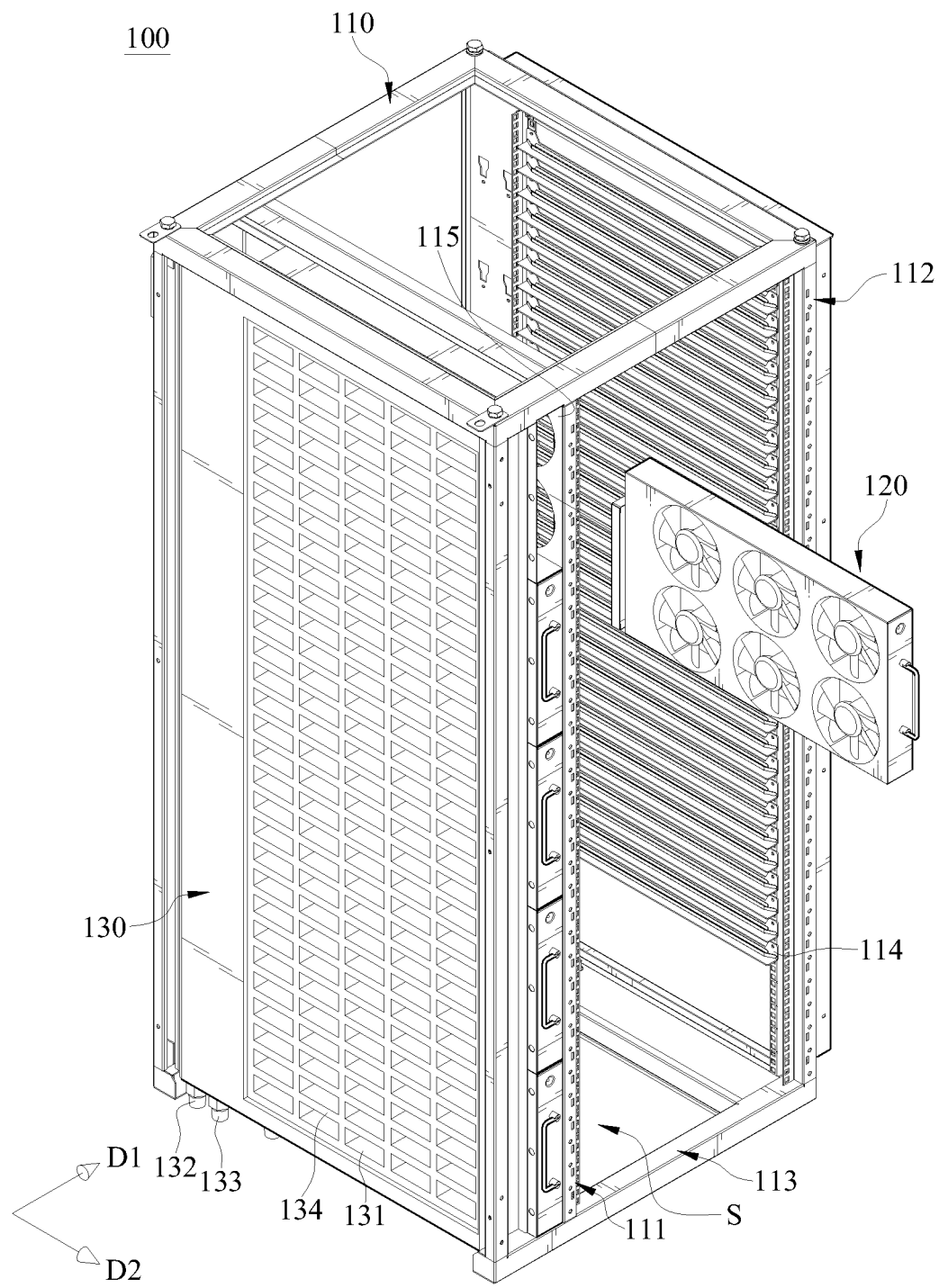
FIG. 2 is a schematic partially exploded view of an embodiment of the present invention.
Figure 3:
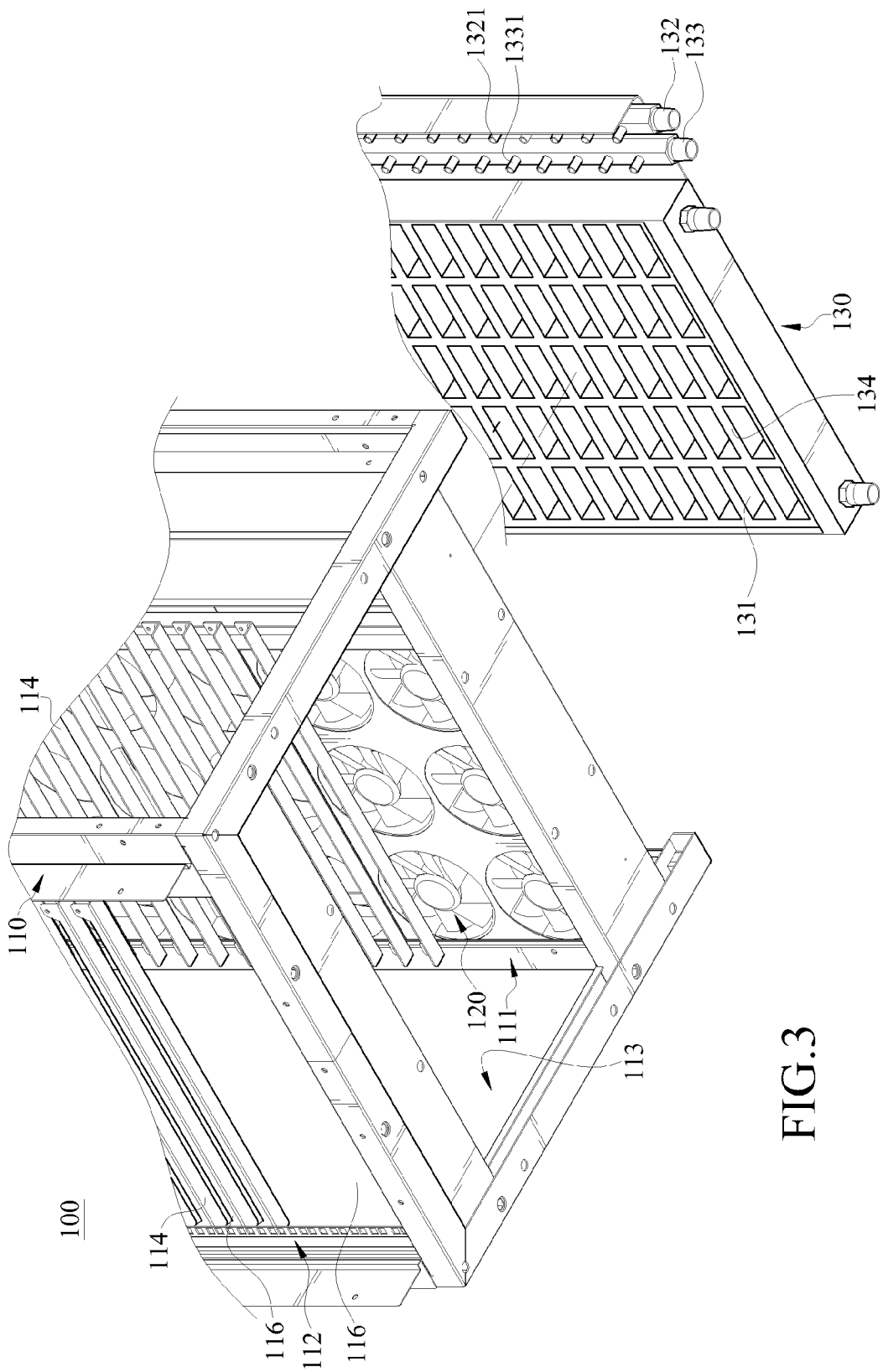
FIG. 3 is a schematic partially enlarged exploded view of an embodiment of the present invention from another angle of view.
Figure 4:
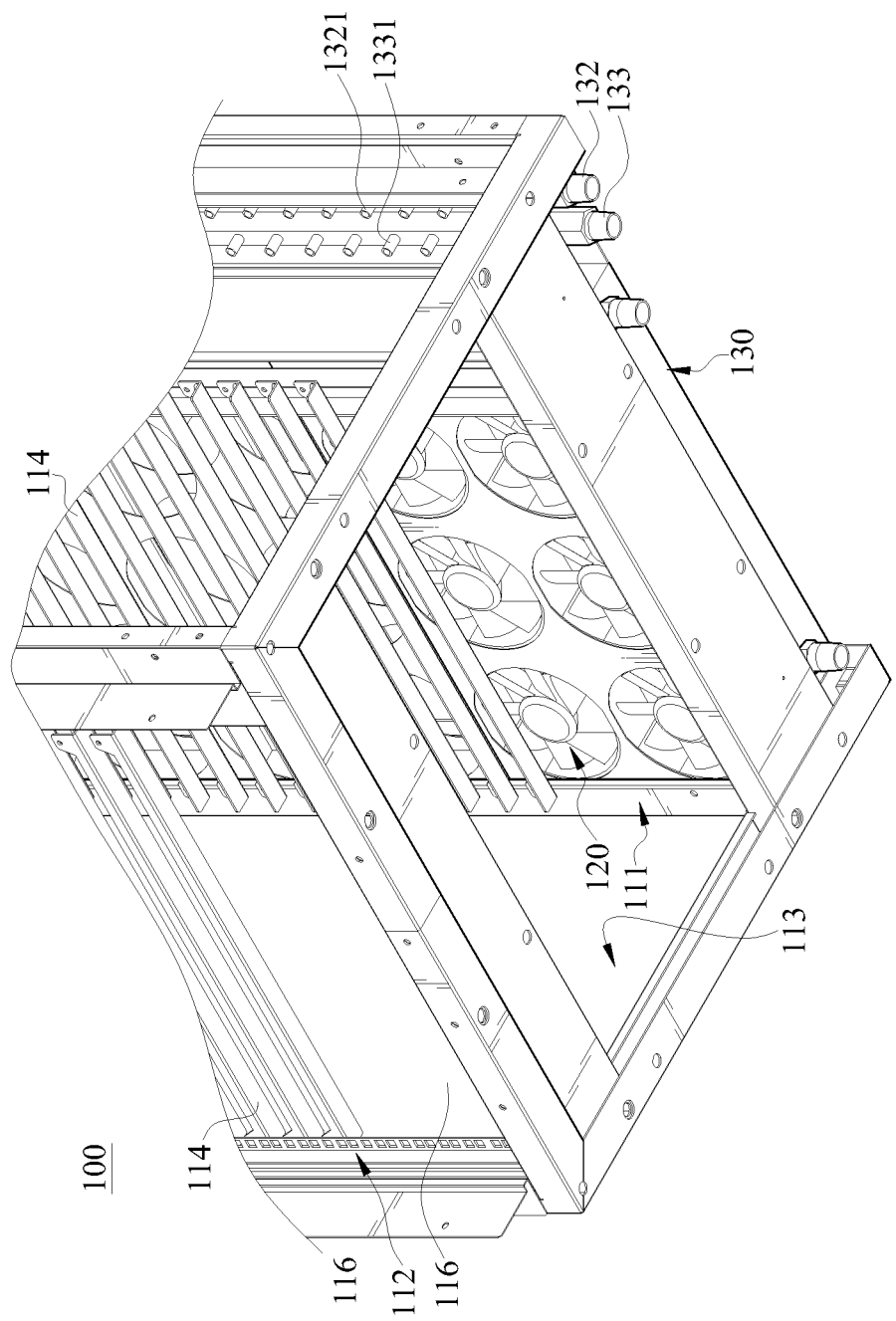
FIG. 4 is a schematic partially enlarged assembled view of an embodiment of the present invention from another angle of view.

As shown in FIGS. 1 to 4, according to an embodiment of the present invention, a server cabinet 100 comprises a rack 110, at least one fan 120 and a radiator 130. The rack 110 is a hollow rack constituted by multiple steel bars, steel plates, and angle steel, and the rack 110 has a first frame 111 and a second frame 112 opposite to each other and disposed at an interval. The first frame 111 and the second frame 112 are arranged along a first direction D1, and an accommodation space S is formed between the first frame 111 and the second frame 112. An opening 113 in communication with the accommodation space S is formed between the first frame 111 and the second frame 112, and the opening 113 faces a second direction D2 and is located on the rack 110, so that the inside of the rack 110 is in communication with the outside through the opening 113. The second direction D2 and the first direction D1 are perpendicular to each other.

Moreover, one side of the first frame 111 adjacent to the accommodation space S has at least one guide rail 114 protruding inwards there-from, and one side of the second frame 112 has at least one the other guide rail 114 corresponding to the guide rail 114 of the first frame 111 and protruding inwards there-from, too. Meanwhile, the direction of long axis of all of the guide rails 114 are parallel to the second direction D2, so the placement position of the guide rails 114 and the first direction D1 interfere with each other. The guide rails 114 may be, but is not limited to, L-shaped angle steel. Furthermore, the first frame 111 has an air inlet along the first direction D1, and the second frame 112 has an air outlet 116 along the first direction D1. The guide rails 114 are symmetrically disposed at an interval on the sides of the first frame 111 and the second frame 112, respectively, so that a gap exists between two adjacent guide rails 114, and an airflow can flow from the air inlet into the accommodation space S and flow from the air outlet 116 to the outside of the rack 110 through the gap between the guide rails 114 of the first frame 111 and the second frame 112, respectively.

In addition, the other side of the first frame 111 opposite to the second frame 112 is fixedly disposed with at least one assembling frame 115, and the fan 120 is detachably disposed in the assembling frame 115 along the second direction D2, so that the fan 120 is temporarily held on the first frame 111 of the rack 110, and the mounting position thereof remains unchanged. The radiator 130 is also disposed on the other side of the first frame 111 opposite to the second frame 112, and one side of the radiator 130 is exposed outside of the rack 110, so that the assembling frame 115 is sandwiched and retained between the radiator 130 and the first frame 111 along the first direction D1. The radiator 130 has a hollow structure inside, and the radiator 130 has a plurality of heat dissipation holes 131 corresponding to the air inlet of the first frame 111. The plurality of heat dissipation holes 131 is distributed on the radiator 130 at an interval, and a plurality of heatsink fins 134 is formed on the radiator 130. In addition, the radiator 130 further has a water supply pipeline 132 and a water drain pipeline 133. One end of the water supply pipeline 132 and one end of the water drain pipeline 133 are inserted into the radiator 130. The other end of the water supply pipeline 132 and the other end of the water drain pipeline 133 are exposed outside the rack 110, and are connected to a tank (not shown) storing a coolant. A pump (not shown) is connected to the tank to pump the coolant from the tank to the water supply pipeline 132.

The end of the water supply pipeline 132 inserted into the radiator 130 has at least one water inlet pipe 1321, and the end of the water drain pipeline 133 inserted into the radiator 130 has at least one water outlet pipe 1331. The water inlet pipe 1321 and the water outlet pipe 1331 are corresponding to the guide rail 114 disposed on the first frame 111, and the water inlet pipe 1321 and the water outlet pipe 1331 are located between two adjacent guide rails 114. Meanwhile, the water inlet pipe 1321 and the water outlet pipe 1331 extend from the first frame 111 of the rack 110 into the accommodation space S respectively.

Figure 5:
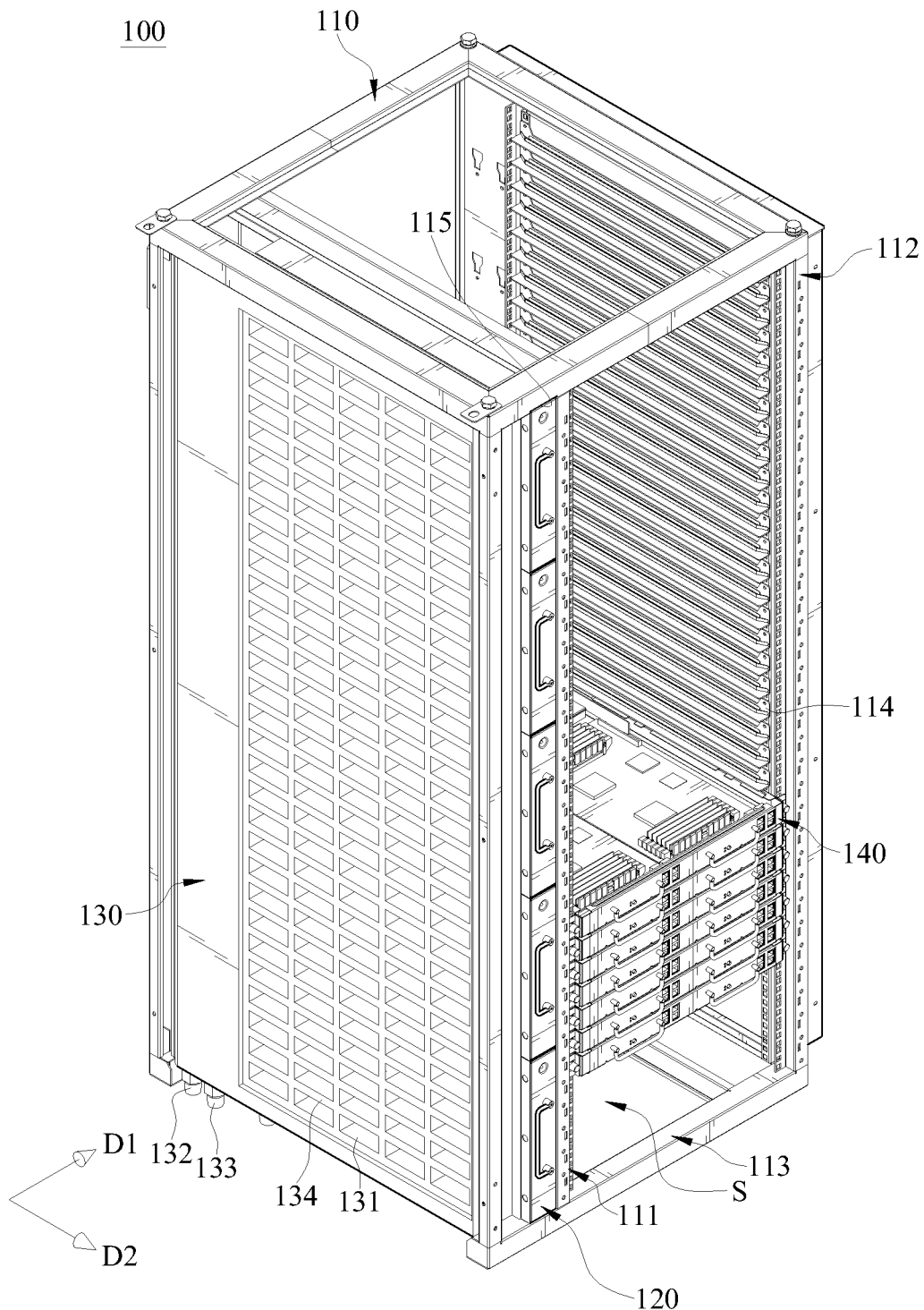
FIG. 5 is a schematic view illustrating a use state of an embodiment of the present invention.

Referring to FIGS. 1 to 5, in an embodiment of the present invention, the server cabinet 100 is used to load a server 140, and dissipate heat when the server 140 is operating, so as to maintain an operating temperature of the server 140. The server 140 is loaded in the accommodation space S of the rack 110, in which two opposite ends of the server 140 are placed on the corresponding guide rails 114 on the first frame 111 and the second frame 112 respectively, and then the server 140 slides into the accommodation space S from the opening 113 of the rack 110 under the guide of the guide rails 114 between the first frame 111 and the second frame 112, and is supported by the guide rails 114.

A heating element (such as a micro-processing chip or a central processing unit), a water block connected to the heating element, and other electronic components (such as a circuit board and an interface card) are disposed in the server 140. When the server 140 is loaded in the accommodation space S, the radiator 130 is connected to the water block (not shown) of the server 140 through the water inlet pipe 1321 of the water supply pipeline 132 and the water outlet pipe 1331 of the water drain pipeline 133 respectively. The coolant outside the rack 110 is transferred to the radiator 130 through the water supply pipeline 132, and flows inside the radiator 130 to the plurality of heatsink fins 134. The coolant is transferred from the radiator 130 to the water block through the water inlet pipe 1321 of the water supply pipeline 132, so that the coolant undergoes heat exchange in the water block to carry away the heat generated by the heating element. Then, the coolant after the heat exchange is drained to the outside of the rack 110 through the water drain pipeline 133, so that the coolant flows among the tank, the radiator 130 and the water block in a circulating manner, so as to dissipate the heat of the heating element of the server 140 and keep the radiator 130 at a preset low temperature, for example, lower than an internal temperature of the rack 110 when the server 140 is operating.

Moreover, the server cabinet 100 may also use the fan 120 to dissipate the heat of the server 140. The fan 120 is electrically connected to and driven by an external power supply device. The fan 120 draws (or guides) an outside airflow to the first frame 111 of the rack 110 through the plurality of heat dissipation holes 131 of the radiator 130. The airflow contacts the plurality of heatsink fins 134 in the plurality of heat dissipation holes 131, and exchanges heat with the plurality of heatsink fins 134, so that the temperature of the airflow flowing to the first frame 111 is kept lower than the internal temperature of the rack. Then, the fan 120 blows the airflow from the first frame 111 to the server 140, and the airflow dissipates heat of the heating element, the water block and other electronic components disposed in the server 140 by convection, so that the airflow flows through the accommodation space S along the first direction D1 of the rack 110, and is then blown to the outside of the rack 110 through the air outlet 116 of the second frame 112 of the rack 110. In the process, since the fan 120 is disposed between the radiator 130 and the first frame 111 of the rack 110, the airflow generated by the fan 120 can be blown to the server 140 directly through the air inlet of the first frame 111 without being blocked by the radiator 130, so that the airflow can be prevented from flowing back in the accommodation space S, and can form a steady flow field in the accommodation space S, to exchange the heat generated by the server 140 by thermal convection in a continuous and efficient manner. Afterwards, the airflow is exhausted from the air outlet 116 of the second frame 112 to the outside of the rack 110, thus keeping the server 140 operating at an operating temperature thereof.

It should be noted that, in the present invention, the number of the fan 120 is multiple, the number of the assembling frame 115 is multiple, the number of the heat dissipation hole 131 of the radiator 130 is multiple, and the number of the heatsink fin 134 of the radiator 130 is multiple, so as to provide an optimal heat dissipation effect to the server cabinet 100. The number of the guide rail 114 of the rack 110 is multiple, the number of the water inlet pipe 1321 of the water supply pipeline 132 of the radiator 130 is multiple, and the number of the water outlet pipe 1331 of the water drain pipeline 133 of the radiator 130 is also multiple, so that a single server cabinet 100 can be loaded with a plurality of servers 140, and can exchange heat with the plurality of servers 140 through the water supply pipeline 132 and the water drain pipeline 133 one by one, thus achieving an optimal operation performance of the server cabinet. The numbers of the components of the server cabinet 100 are corresponding to each other, and those skilled in the art may adjust the numbers according to practical requirements, which are not limited to the embodiments of the present invention.

In the server cabinet of the present invention, the fan is disposed between the radiator and the first frame of the rack, so that the outside air is guided by the fan to flow from the air inlet of the first frame into the rack, forms an airflow in the rack for being directly blown to each of the servers, carries away the heat generated by each of the servers by thermal convection, and is exhausted from the air outlet of the second frame to the outside, so as to prevent the airflow from easily flowing back in the rack after the heat exchange. Meanwhile, since the airflow guided by the fan first contacts the heatsink fins of the radiator, the temperature of the airflow entering the rack can be kept lower than the internal temperature of the rack. Moreover, the airflow is then directly blown by the fan to each of the servers, so that a steady flow field is generated in the rack, thus achieving a stable heat dissipation performance.

In addition, since the water supply pipeline and the water drain pipeline of the radiator are in communication with the inside of the radiator, and are directly connected to the water block of each of the servers, the coolant inside the radiator flows to the plurality of heatsink fins, and is circulated between the tank and the water block for heat exchange with the radiator and the heating elements of the plurality of servers at the same time, so that not only the radiator can be kept at a preset low temperature to exchange heat with the airflow, but also it can be ensured that each of the servers can be kept at a steady operating temperature, thus greatly improving the overall heat dissipation performance of the server cabinet of the present invention.

What is claimed is:

1. A server cabinet, comprising:
   a rack, having a first frame and a second frame opposite to each other, wherein an accommodation space is formed inside the rack between the first frame and the second frame, the first frame has at least one guide rail and the second frame has at least one the other guide rail corresponding to the guide rail of the first frame in the accommodation space, and two of the corresponding guide rails between the first frame and the second frame are for loading a server;
   at least one assembling frame, mounted on the first frame;
   a radiator, mounted on the assembling frame and having a water supply pipeline, a water drain pipeline and a plurality of heatsink fins, wherein the water supply pipeline transfers a coolant to flow into the plurality of heatsink fins, and the water drain pipeline drains the coolant from the plurality of heatsink fins; and
   at least one fan, detachably disposed in the assembling frame, wherein the fan guides an airflow to flow into the first frame from the radiator, and blows the airflow to the second frame through the accommodation space,
   wherein the water supply pipeline and the water drain pipeline are connected to the server respectively, and the coolant flows through the server.

2. The server cabinet according to claim 1, wherein the radiator has a plurality of heat dissipation holes, the plurality of heat dissipation holes is located between the plurality of heatsink fins, and the fan guides the airflow from the plurality of heat dissipation holes to the first frame.

3. The server cabinet according to claim 1, wherein the radiator has a hollow structure inside.

4. The server cabinet according to claim 1, wherein the second frame of the rack further has an air outlet, through which the airflow generated by the fan is blown to the outside of the rack.

5. The server cabinet according to claim 1, wherein the rack further has an opening, the opening is located between the first frame and the second frame, and the opening is in communication with the accommodation space.

6. A server cabinet, comprising:
   a rack, having a first frame and a second frame opposite to each other, wherein an accommodation space is formed inside the rack between the first frame and the second frame, the first frame has at least one guide rail and the second frame has at least one the other guide rail corresponding to the guide rail of the first frame in the accommodation space, and two of the corresponding guide rails between the first frame and the second frame are for loading a server;
   at least one assembling frame, mounted on the first frame;
   a radiator, mounted on the assembling frame and having a water supply pipeline, a water drain pipeline and a plurality of heatsink fins, wherein the water supply pipeline transfers a coolant to flow into the plurality of heatsink fins, and the water drain pipeline drains the coolant from the plurality of heatsink fins; and
   at least one fan, detachably disposed in the assembling frame, wherein the fan guides an airflow to flow into the first frame from the radiator, and blows the airflow to the second frame through the accommodation space,
   wherein the water supply pipeline has at least one water inlet pipe, the water drain pipeline has at least one water outlet pipe, the water inlet pipe and the water outlet pipe are corresponding to the guide rail of the first frame, and the water inlet pipe and the water outlet pipe extend from the first frame into the accommodation space.

7. The server cabinet according to claim 6, wherein the radiator has a plurality of heat dissipation holes, the plurality of heat dissipation holes is located between the plurality of heatsink fins, and the fan guides the airflow from the plurality of heat dissipation holes to the first frame.

8. The server cabinet according to claim 6, wherein the radiator has a hollow structure inside.

9. The server cabinet according to claim 6, wherein the second frame of the rack further has an air outlet, through which the airflow generated by the fan is blown to the outside of the rack.

10. The server cabinet according to claim 6, wherein the rack further has an opening, the opening is located between the first frame and the second frame, and the opening is in communication with the accommodation space.

* * * * *